US006738612B1

(12) United States Patent
Imbornone et al.

(10) Patent No.: US 6,738,612 B1
(45) Date of Patent: May 18, 2004

(54) IMAGE TRAP FILTER

(75) Inventors: James F. Imbornone, Methuen, MA (US); Jean-Marc Mourant, Groton, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/543,799

(22) Filed: Apr. 6, 2000

(51) Int. Cl.$^7$ ................................................ H04B 1/10
(52) U.S. Cl. ..................... 455/307; 455/182.3; 455/302; 455/323; 455/296
(58) Field of Search ................................. 455/307, 285, 455/286, 287, 289, 290, 195.1, 197.3, 150.1, 334–340, 283, 292, 196.1, 197.1, 197.2, 198.1, 187.1, 182.3, 302, 183.1, 182.2, 182.1, 179.1; 331/53; 330/152–200, 295, 133; 329/318–325, 304, 346; 327/355–359

(56) References Cited

U.S. PATENT DOCUMENTS

| 4,276,573 | A | * | 6/1981 | Halpern et al. ................. 360/45 |
| 4,500,854 | A | * | 2/1985 | Meyer ..................... 331/117 R |
| 4,516,270 | A | | 5/1985 | Phillips |

(List continued on next page.)

FOREIGN PATENT DOCUMENTS

| EP | 608815 A1 | * | 8/1994 | ............ H03D/7/18 |
| GB | 1045550 | | 10/1966 | |
| GB | 2 259 819 A | | 3/1993 | |
| JP | 53-22402 | | 7/1978 | |
| JP | 01-160738 | | 11/1989 | |
| JP | 4-284078 | | 10/1992 | |
| JP | 9-98044 | | 4/1997 | |
| JP | 11-289504 | | 10/1999 | |

OTHER PUBLICATIONS

"Hybrid Microstip Mixer and Circuits Constructed Therefrom," IBM Technical Disclosure Bulletin, vol. 17, No. 6, pp. 1571–1572 (Nov. 1974).
J. Imbornone, J. Mourant, T. Tewksbury, "Image Reject Receiver for GSM/DCS/PCS I nSiGe BiCMOS," IBM Microelectronics.
Other: Document in Japanese FIS9990229, 2 pages.

*Primary Examiner*—Pablo N. Tran
(74) *Attorney, Agent, or Firm*—RatnerPrestia; Joseph P. Abate, Esq.

(57) ABSTRACT

An image trap filter used in a radio frequency receiver for filtering an image signal from a radio frequency signal. The image trap filter includes an inductor and a capacitor connected in series in a first branch with the first branch connected in parallel with an impedance in a second branch. For low-side injection of the local oscillator signal (i.e., the frequency of the local oscillator signal is lower than the radio frequency signal), the impedance in the second branch is a capacitor and the series-connected inductor and capacitor in the first branch resonate at the frequency of the image signal and present a low impedance at the frequency of the image signal and a somewhat higher inductive impedance at the frequency of the radio frequency signal that resonates with the capacitor in the second branch at the frequency of the radio signal. For high-side injection of the local oscillator signal (i.e., the frequency of the local oscillator signal is higher than the frequency of the radio frequency signal), the impedance in the second branch is an inductor and the series-connected inductor and capacitor in the first branch resonate at the frequency of the image signal and present a low impedance at the frequency of the image signal and a somewhat higher capacitive impedance at the frequency of the radio frequency signal that resonates with the inductor in the second branch at the frequency of the radio signal.

14 Claims, 2 Drawing Sheets

U.S. PATENT DOCUMENTS

| | | | |
|---|---|---|---|
| 4,831,661 A | * | 5/1989 | Suzuki .................... 455/302 |
| 4,835,608 A | * | 5/1989 | Lachiw et al. ............ 348/733 |
| 5,428,828 A | * | 6/1995 | Pugel et al. ............ 455/191.2 |
| 5,539,359 A | * | 7/1996 | Goma .................... 331/117 D |
| 5,584,056 A | | 12/1996 | Kim |
| 5,630,225 A | | 5/1997 | Corman |
| 5,678,220 A | | 10/1997 | Fournier |
| 5,742,897 A | * | 4/1998 | Plowdrey et al. ........... 455/142 |
| 5,870,670 A | | 2/1999 | Ripley et al. |
| 5,963,842 A | * | 10/1999 | Kinugawa .................... 725/68 |
| 6,553,216 B1 | * | 4/2003 | Pugel et al. ................ 455/340 |
| 6,573,949 B1 | * | 6/2003 | Yamamoto ................. 348/731 |

* cited by examiner

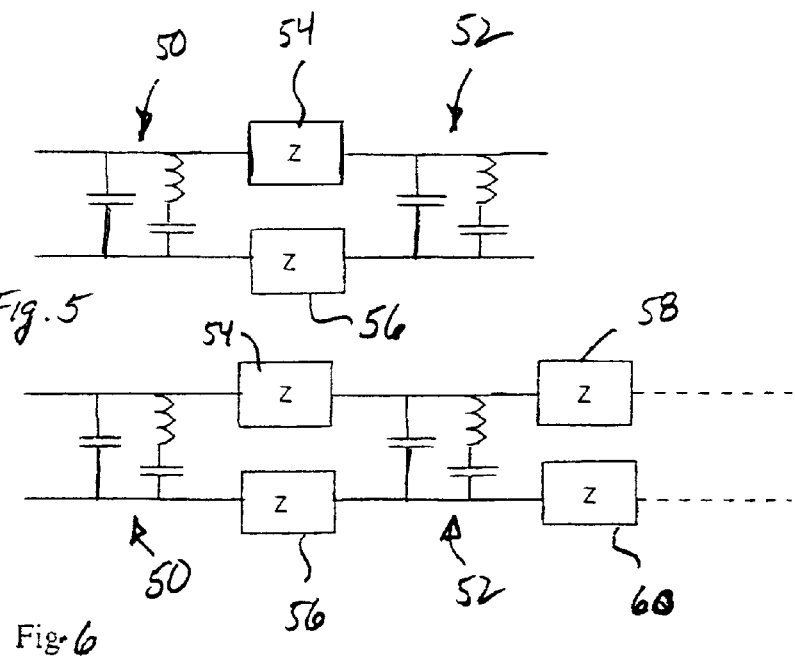
Fig. 5
Fig. 6
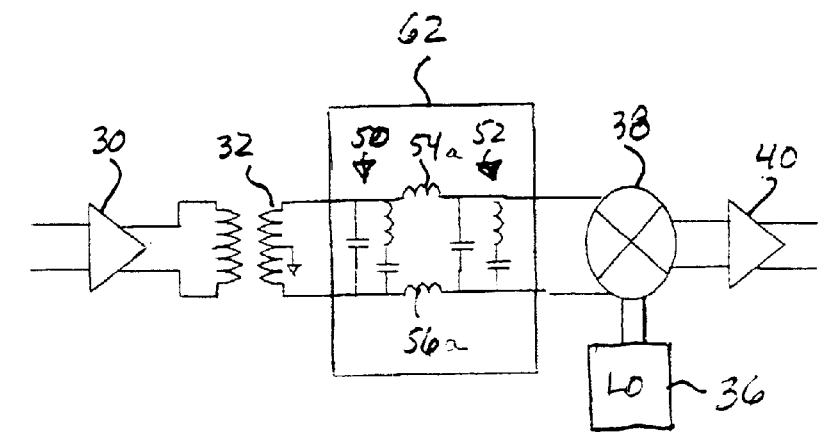
Fig. 7

IMAGE TRAP FILTER

TECHNICAL FIELD

The present invention relates, in general, to the rejection of the image signal of a radio frequency signal converted to an intermediate frequency and in particular, to a frequency conversion mixer especially suited to be implemented on an integrated circuit.

BACKGROUND OF THE INVENTION

Unlike wireline communications, the wireless environment accommodates essentially an unlimited number of users sharing different parts of the frequency spectrum and very strong signals coexist next to very weak signals. A radio receiver must be able to select the signal of interest, while rejecting all others.

Among the important problems faced by the designers of radio receivers are image rejection add monolithic integration. A radio receiver must be able to select the desired signal from its image. Otherwise, the subsequent detector circuit will be unable to distinguish between the desired signal and the image signal and, therefore, the output will be the result of the superposition of both. As wireless communications units evolve, means to reduce cost, size, and weight through monolithic integration are critical.

In conventional heterodyne receiver architectures, a large and expensive ceramic or Surface Acoustic Wave (SAW) filter is positioned between the low noise amplifier and the mixer to suppress the image signal. This arrangement is attractive in terms of current consumption. The arrangement defies integration, however, and results in excessive size, weight, and cost.

There also have been efforts to use phasing methods to achieve image signal rejection in the mixer itself. U.S. Pat. Nos. 5,870,670 and 5,678,220 provide examples of such efforts. Image reject mixers in which phasing methods are used are at best, however, only capable of achieving 30 dB of image rejection over the typical temperatures and processes used. The limitation, in terms of reliable image rejection from the phasing methods, comes from the required amplitude and phase balance in the local oscillator quadrature generation and intermediate frequency quadrature combining. It can be shown mathematically that achieving even 30 dB of image rejection using the phasing method requires less than 1° and 0.5 dB of phase and amplitude balance, respectively. The phasing methods of achieving image rejection, while improvements in terms of integration and cost, require additional filtering to meet overall system image rejection.

Other attempts at image rejection have involved image "traps" in the form of a simple series inductance capacitance (or "L-C") circuit across the differential line. This approach results in an excess inductance in the desired band that must be tuned out. Traditionally, a series capacitor has been used to tune out the inband inductance. This approach suffers, however, from the fact that an additional mixer DC return is required. An on-chip choke, to provide this DC return, would be large and have considerable DC resistance. The increased space requirements add expense and the increased DC resistance in the ground return path lowers the voltage headroom on the mixer limiting its dynamic range.

U.S. Pat. No. 5,630,225 describes an arrangement by which a dielectric member is placed in proximity to a transmission line. The electromagnetic properties of this member alter the frequency response characteristic of the system by the formation of a notch at the image signal frequency. Such an arrangement is not amenable to monolithic integration. The dielectric member does not have the requisite electrical characteristics for such an application and the physical size of the dielectric member makes it unsuitable for monolithic integration.

To overcome the shortcomings of the prior ways of achieving image signal rejection considered above, a new image trap fitter is provided by the present invention. One object of the present invention is to provide a new and improved image trap filter. Another object of the present invention is to provide a new and improved radio frequency receiver. A further object of the present invention is to provide a new and improved image trap filter that is particularly suited for implementation in an integrated circuit.

SUMMARY OF THE INVENTION

To achieve these and other objects, and in view of its purposes, the present invention provides an image trap filter for filtering an image signal from a radio frequency signal. The image trap filter, as constructed in accordance with the present invention, includes a first branch having an inductor and a capacitor connected in series and a second branch connected in parallel with the fast branch and having an impedance. The series-connected inductor and capacitor in the first branch resonate at the frequency of the image signal and present a low impedance at the frequency of the image signal and present an impedance at the frequency of the radio frequency signal that resonates with the impedance in the second branch to present a high impedance at the frequency of the radio frequency signal.

A radio frequency receiver, constructed in accordance with the present invention, includes an element for receiving a radio frequency signal and an image trap filter for filtering an image signal from the radio frequency signal. The image trap filter includes a first branch having an inductor and a capacitor connected in series and a second branch connected in parallel with the first branch and having an impedance. The series-connected inductor and capacitor in the first branch resonate at the frequency of the image signal and present a low impedance at the frequency of the image signal and present an impedance at the frequency of the radio frequency signal that resonates with the impedance in the second branch to present a high impedance at the frequency of the radio frequency signal. A radio frequency receiver, constructed in accordance with the present invention, further includes a local oscillator, a mixer responsive to the local oscillator and the output of the image trap filter for developing an intermediate frequency signal, and an element for amplifying the intermediate frequency signal.

It is to be understood that both the foregoing general description and the following detailed description are exemplary, but are not restrictive, of the invention.

BRIEF DESCRIPTION OF THE DRAWING

The present invention is best understood from the following detailed description when read in conjunction with the accompanying drawing. Included in the drawing are the following figures.

FIG. 5 is a circuit diagram of a third embodiment of an image trap filter constructed in accordance with the present invention;

FIG. 6 is a circuit diagram of a fourth embodiment of an image trap filter constructed in accordance with the present invention; and FIG. 7 is a circuit diagram showing the FIG. 5 image trap filter in a radio frequency receiver in accordance with the present invention.

DETAILED DESCRIPTION OF THE INVENTION

Figures 1A, 1B, 1C:
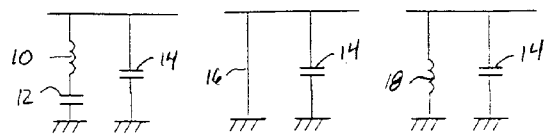
FIG. 1A is a circuit diagram of a first embodiment of an image trap filter constructed in accordance with the present invention for low-side injection of the local oscillator frequency.
FIG. 1B is a circuit diagram of the functional equivalent circuit of the FIG. 1A image trap filter at the frequency of the image signal.
FIG. 1C is a circuit diagram of the functional equivalent circuit of the FIG. 1A image trap filter at the frequency of the radio frequency signal that contains the image signal.

Referring now to the drawing, in which like reference numbers refer to like elements throughout, FIG. 1A shows an image trap filter for filtering an image signal from a radio frequency signal. In accordance with a first embodiment of the present invention, the image trap filter includes a first branch having an inductor 10 and a capacitor 12 connected in series and a second branch connected in parallel with the first branch and having an impedance, namely a capacitor 14. The image trap filter shown in FIG. 1A is for low-side injection of a local oscillator signal supplied to a mixer which is not shown in FIG. 1A but is located downstream of the image trap filter (i.e., the frequency of the local oscillator is lower than the frequency of the radio frequency signal).

The series-connected inductor 10 and capacitor 12 of FIG. 1A resonate at the frequency of the image signal and present a low impedance at the frequency of the image signal and a somewhat higher impedance at the frequency of the radio frequency signal. The short-circuit 16 in the first branch in FIG. 1B represents the low impedance at the frequency of the image signal and the inductor 18 in the first branch in FIG. 1C represents an inductive impedance at the frequency of the radio signal. Capacitor 14 in the second branch resonates with the first branch, namely the inductive impedance of the inductor 18, to present a high impedance at the frequency of the radio frequency signal.

Figures 2A, 2B, 2C:
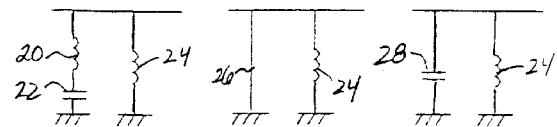
FIG. 2A is a circuit diagram of a second embodiment of an image trap filter constructed in accordance with the present invention for highside injection of the local oscillator frequency.
FIG. 2B is a circuit diagram of the functional equivalent circuit of the FIG. 2A image trap filter at the frequency of the image signal.
FIG. 2C is a circuit diagram of the functional equivalent circuit of the FIG. 2A image trap filter at the frequency of the radio frequency signal that contains the image signal.

Referring to FIG. 2A, an image trap filter for file an image signal from a radio frequency signal, in accordance with a second embodiment of the present invention, includes a first branch having an inductor 20 ant a capacitor 22 connected in series and a second branch connected in parallel with the first branch and having an impedance namely an inductor 24. The image trap filter shown in FIG. 2A is for high side injection of a local oscillator signal supplied to a mixer which is not shown in FIG. 2A but is located downstream of the image trap filter (ie., the frequency of the local oscillator is higher than the frequency of the radio frequency signal).

The series-connected inductor 20 and capacitor 22 of FIG. 2A resonate at the frequency of the image signal and present a low impedance at the frequency of the image signal and a somewhat higher impedance at the frequency of the radio frequency signal. The short-circuit 26 in the first branch in FIG. 2B represents the low impedance at the frequency of the image signal and the capacitor 28 in the first branch in FIG. 2C represent a capacitive impedance at the frequency of the radio signal. Inductor 24 in the second branch resonates with the first branch, namely the capacitive impedance of the capacitor 28, to present a high impedance at the frequency of the radio frequency signal.

Figure 3:
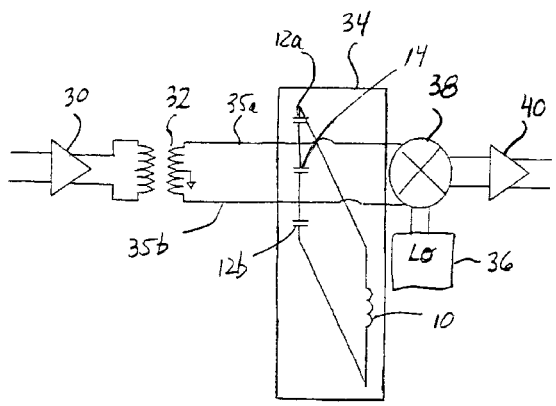
FIG. 3 is a circuit diagram showing the FIG. 1A image trap filter in a radio frequency receiver in accordance with the present invention.

Referring to FIG. 3, which is a circuit diagram of a radio frequency receiver having the FIG. 1A image trap filter constructed in accordance with the present invention, this radio frequency receiver includes an element for receiving a radio frequency signal. The element can include a low-noise amplifier 30 of conventional construction and operation, a center-tapped grounded secondary transformer 32 of conventional construction and operation, and an antenna of conventional construction and operation (not shown) by which a received radio frequency signal is conducted to the circuitry of the receiver.

A radio frequency receiver, constructed in accordance with the present invention, also includes an image trap filter 34, such as the one illustrated by FIG. 1A, for filtering an image signal from the radio frequency signal. An image trap filter, constructed in accordance with the present invention, lends itself to balanced architectures, as illustrated by FIG. 3, which are required for highly integrated radio frequency integrated circuit receivers due to isolation concerns. In particular, capacitor 14 of FIG. 1A is connected between lines 35a and 35b and capacitor 12 of FIG. 1A is shown as two capacitors 12a and 12b connected in series with inductor 10 of FIG. 1A. Image trap filter 34 of FIG. 3, implemented between the balanced lines in FIG. 3, operates as described above in connection with FIGS. 1A, 1B, and 1C to output a radio frequency signal minus the image signal.

A radio frequency receiver, constructed in accordance with the present invention, further includes a local oscillator 36 ("LO") of conventional construction and operation and a mixer 38 of conventional construction and operation responsive to the local oscillator and the output of image trap filter 34 for developing an intermediate frequency signal. A radio frequency receiver, constructed in accordance with the present invention, further includes an intermediate frequency amplifier 40 of conventional construction and operation.

Figure 4:
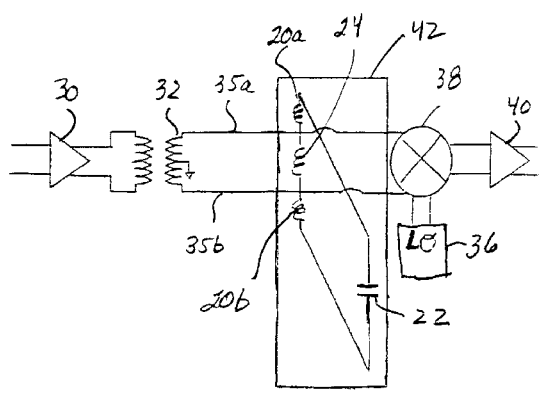
FIG. 4 is a circuit diagram showing the FIG. 2A image trap filter in a radio frequency receiver in accordance with the present invention.

FIG. 4 is a circuit diagram of a radio frequency receiver constructed in accordance with the present invention having the FIG. 2A image trap filter. In particular, inductor 24 of FIG. 2A is connected between lines 35a and 35b and inductor 20 of FIG. 2A is shown as two inductors 20a and 20b connected in series with capacitor 22 of FIG. 2A Image trap filter 42, implemented between the balanced lines in FIG. 4, operates as described above in connection with FIGS. 2A, 2B, and 2C to output a radio frequency signal minus the image signal. The remainder of the radio frequency receiver, shown in FIG. 4, is arranged identical to the FIG. 3 radio frequency receiver and operates identical to the FIG. 3 radio frequency receiver in developing an intermediate frequency signal.

The present invention solves the image signal problem with a relatively simple and cost-efficient solution to image signal filtering between the low-noise amplifier and the mixer in a radio frequency receiver. An image trap filter, constructed in accordance with the present invention, provides a low impedance to reject the image signal by series resonating the inductor and capacitor in the first branch at the image signal frequency and parallel resonating the equivalent impedance in the first branch with the impedance in the second branch to present a high impedance at the frequency of the radio frequency signal. The high impedance at the frequency of the radio frequency signal does not disturb the normal operation of the low-noise amplifier and mixer of the radio frequency receiver.

The base image trap filter, constructed in accordance with the present invention, can be used as a single-stage image trap filter (as illustrated by FIGS. 1A and 2A) or in cascade as a multi-stage image trap filter as illustrated in FIGS. 5 and 6 when wider bandwidths and higher levels of image frequency signal rejection are required. It is important to note that when cascading the image trap filter sections constructed in accordance with the present invention, an impedance is placed between the image trap filter sections to isolate the poles. FIG. 5 shows two image trap filter stages 50 and 52 separated by a pair of impedance sections 54 and 56. In particular, a first impedance section 54 is connected between a first end of first stage 50 and a first end of second stage 52, and a second impedance section 56 is connected between a second end of first stage 50 and a second end of second stage 52. FIG. 6 shows four impedance sections 54, 56, 58, and 60 placed between image trap filter stages 50, 52 and others not shown. Impedance sections 54, 56, 58, and 60 can be either an inductor or a capacitor. In order to maintain a DC return path for the mixer, however, an inductor is preferred.

FIG. 7 is a circuit diagram showing a two-stage image trap filter 62 comparable to the two-stage image trap filter of FIG. 5 implemented in a radio frequency receiver. In particular, image trap filter 62 includes stages 50 and 52 that are separated by inductors 54a and 56a.

The radio frequency receiver of FIG. 7 also include low noise amplifier 30 of conventional construction and operation, center-tapped grounded secondary transformer 32 of conventional construction and operation, and an antenna of conventional construction and operation (not shown) by which a received radio frequency signal is conducted to the circuitry of the receiver. The FIG. 7 radio frequency receiver further includes local oscillator 36 of conventional construction and operation, mixer 38 of conventional construction and operation responsive to local oscillator 36 and the output of image trap filter 62 for developing an intermediate frequency signal, and intermediate frequency amplifier 40 of conventional construction and operation.

Although illustrated and described above with reference to certain specific embodiments, the present invention nevertheless is not intended to be limited to the details shown. Rather, various modifications may be made in the details within the scope and range of equivalents of the claims and without departing frown the spirit of the invention.

What is claimed:

1. An image trap filter for filtering an image signal from a radio frequency signal, said image trap filter comprising:
   a first branch having an inductor and a capacitor connected in series and:
   (a) resonating at the frequency of the image signal and presenting a low impedance at the frequency of the image signal, and
   (b) presenting an impedance at the frequency of the radio frequency signal;
   a second branch connected in parallel with said first branch and having an impedance resonating with said first branch to present a high impedance at the frequency of the radio frequency signal; and
   respective ends of the second branch connected to opposite electrically balanced input signal lines.

2. An image trap filter according to claim 1 wherein:
   (a) said impedance presented by said first branch at the frequency of the radio frequency signal is inductive, and
   (b) said impedance in said second branch is capacitive.

3. An image trap filter according to claim 1 wherein:
   (a) said impedance presented by said first branch at the frequency of the radio frequency signal is capacitive, and
   (b) said impedance in said second branch is inductive.

4. The image trap filter of claim 1 wherein:
   the capacitor of the first branch includes first and second capacitors, and
   ends of the inductor of the first branch are connected to the first and second capacitors, respectively.

5. The image trap filter of claim 1 wherein:
   the inductor of the first branch includes first and second inductors, and
   ends of the capacitor of the first branch are connected to the first and second inductors, respectively.

6. An image trap filter for filtering an image signal from a radio frequency signal, said image trap filter comprising:
   a first stage having:
      (a) a first branch having an inductor and a capacitor connected in series and:
         (1) resonating at the frequency of the image signal and presenting a low impedance at the frequency of the image signal, and
         (2) presenting an impedance at the frequency of the radio frequency signal; and
      (b) a second branch connected in parallel with said first branch of said first stage and having an impedance resonating with said first branch of said first stage to present a high impedance at the frequency of the radio frequency signal;
   a second stage having:
      (a) a first branch having an inductor and a capacitor connected in series and:
         (1) resonating at the frequency of the image signal and presenting a low impedance at the frequency of the image signal, and
         (2) presenting an impedance at the frequency of the radio frequency signal, and
      (b) a second branch connected in parallel with said first branch of said second stage and having an impedance resonating with said first branch of said second stage to present a high impedance at the frequency of the radio frequency signal;
   a first impedance connected between a first end of said first stage and a first end of said second stage; and
   a second impedance connected between a second end of said first stage and a second end of said second stage.

7. An image trap filter according to claim 6 wherein:
   (a) said first impedance connected between a first end of said first stage and a first end of said second stage, and
   (b) said second impedance connected between a second end of said first stage and a second end of said second stage are inductors.

8. A radio frequency receiver comprising:
   means for receiving a radio frequency signal;
   an image trap filter for filtering an image signal from the radio frequency signal and including:
      (a) a first branch having an inductor and a capacitor connected in series and:
         (1) resonating at the frequency of the image signal and presenting a low impedance at the frequency of the image signal, and
         (2) presenting an impedance at the frequency of the radio frequency signal;
      (b) a second branch connected in parallel with said first branch and having an impedance resonating with said first branch to present a high impedance at the frequency of the radio frequency signal; and
      (c) respective ends of the second branch connected to opposite electrically balanced input signal lines;

a local oscillator;

a mixer responsive to said local oscillator and the output of said image trap filter for developing an intermediate frequency signal; and means for amplifying the intermediate frequency signal.

9. A radio frequency receiver according to claim 8 wherein:
  (a) said impedance presented by said first branch of said image trap filter at the frequency of the radio frequency signal is inductive, and
  (b) said impedance in said second branch of said image trap filter is capacitive.

10. A radio frequency receiver according to claim 8 wherein:
  (a) said impedance presented by said first branch of said image trap filter at the frequency of the radio frequency signal is capacitive, and
  (b) said impedance in said second branch of said image trap filter is inductive.

11. The radio frequency receiver of claim 8 wherein:
  the capacitor of the first branch includes first and second capacitors, and
  ends of the inductor of the first branch are connected to the first and second capacitors, respectively.

12. The radio frequency receiver of claim 8 wherein:
  the inductor of the first branch includes first and second inductors, and
  ends of the capacitor of the first branch are connected to the first and second inductors, respectively.

13. A radio frequency receiver comprising:
  means for receiving a radio frequency signal;
  an image trap filter for filtering an image signal from the radio frequency signal and including:
    (a) a first stage having:
      (1) a first branch having an inductor and a capacitor connected in series and:
        (i) resonating at the frequency of the image signal and presenting a low impedance at the frequency of the image signal, and
        (ii) presenting an impedance at the frequency of the radio frequency signal, and
      (2) a second branch connected in parallel with said first branch of said first stage and having an impedance resonating with said first branch of said first stage to present a high impedance at the frequency of the radio frequency signal,
    (b) a second stage having:
      (1) a first branch having an inductor and a capacitor connected in series and:
        (i) resonating at the frequency of the image signal and presenting a low impedance at the frequency of the image signal, and
        (ii) presenting an impedance at the frequency of the radio frequency signal, and
      (2) a second branch connected in parallel with said first branch of said second stage and having an impedance resonating with said first branch of said second stage to present a high impedance at the frequency of the radio frequency signal,
    (c) a first impedance connected between a first end of said first stage and a first end of said second stage, and
    (d) a second impedance connected between a second end of said first stage and a second end of said second stage;
  a local oscillator;
  a mixer responsive to said local oscillator and the output of said image trap filter for developing an intermediate frequency signal; and
  means for amplifying the intermediate frequency signal.

14. A radio frequency receiver according to claim 13 wherein:
  (a) said first impedance connected between a first end of said first stage of said image trap filter and a first end of said second stage of said image trap filter, and
  (b) said second impedance connected between a second end of said first stage of said image trap filter and a second end of said second stage of said image trap filter are inductors.

* * * * *